(12) United States Patent
Brunt, Jr. et al.

(10) Patent No.: US 8,646,949 B2
(45) Date of Patent: Feb. 11, 2014

(54) CONSTRAINED FOLDED PATH RESONANT WHITE LIGHT SCINTILLATOR

(75) Inventors: Harold W. Brunt, Jr., Grand Rapids, MI (US); Paul L. Bourget, Kentwood, MI (US)

(73) Assignee: LumenFlow Corp., Middleville, MI (US)

( * ) Notice: Subject to any disclaimer, the term of this patent is extended or adjusted under 35 U.S.C. 154(b) by 923 days.

(21) Appl. No.: 12/716,337

(22) Filed: Mar. 3, 2010

(65) Prior Publication Data

US 2011/0215707 A1 Sep. 8, 2011

(51) Int. Cl.
*F21V 7/09* (2006.01)
(52) U.S. Cl.
USPC .................. 362/303; 362/302; 362/300
(58) Field of Classification Search
USPC ............. 313/114; 362/300, 302, 303; 257/98
See application file for complete search history.

(56) References Cited

U.S. PATENT DOCUMENTS

| | | | |
|---|---|---|---|
| 3,934,148 A | 1/1976 | Collins | |
| 4,241,382 A * | 12/1980 | Daniel | 362/581 |
| 5,347,433 A * | 9/1994 | Sedlmayr | 362/554 |
| 5,572,375 A * | 11/1996 | Crabtree, IV | 359/858 |
| 5,803,579 A | 9/1998 | Turnbull et al. | |
| 5,903,403 A * | 5/1999 | Williamson | 359/868 |
| 6,155,699 A | 12/2000 | Miller et al. | |
| 6,350,041 B1 | 2/2002 | Tarsa et al. | |
| 6,522,065 B1 | 2/2003 | Srivastava et al. | |
| 6,710,544 B2 * | 3/2004 | Schliep et al. | 313/512 |
| 6,759,803 B2 | 7/2004 | Sorg | |
| 6,782,027 B2 | 8/2004 | Cox et al. | |
| 6,791,259 B1 | 9/2004 | Stokes et al. | |
| 6,806,509 B2 | 10/2004 | Yoshino et al. | |
| 6,833,565 B2 | 12/2004 | Su et al. | |
| 6,921,929 B2 | 7/2005 | LeBoeuf et al. | |
| 6,928,099 B2 | 8/2005 | Ledentsov et al. | |
| 6,937,791 B2 | 8/2005 | Guy | |
| 6,960,872 B2 | 11/2005 | Beeson et al. | |
| 7,005,679 B2 | 2/2006 | Tarsa et al. | |
| 7,040,774 B2 | 5/2006 | Beeson et al. | |

(Continued)

FOREIGN PATENT DOCUMENTS

WO 2006/003569 1/2006

OTHER PUBLICATIONS

R. Leutz, L. Fu, and H. Ries, "Carambola optics for recycling of light," Appl. Opt. 45, 2572-2575 (2006).

(Continued)

*Primary Examiner* — Nimeshkumar Patel
*Assistant Examiner* — Christopher Raabe
(74) *Attorney, Agent, or Firm* — Warner Norcross & Judd LLP

(57) ABSTRACT

An optical emitter enabling conversion of light from a light source. The optical emitter includes a first conic reflector defining an aperture for receiving the light source, a second conic reflector opposite the first conic reflector for collimating light emitted by the light source, and a volumetric light conversion element between at least a portion of the first reflector and at least a portion of the second reflector. The optical emitter can also include a convex mirror adjacent the vertex of the second conic reflector, and an elliptical element adjacent the first conic reflector. The light conversion element can include phosphor dispersed in a resin to convert light from a first wavelength to light of a second, longer, wavelength, wherein converted light is emitted from the light conversion element.

23 Claims, 5 Drawing Sheets

(56) References Cited

U.S. PATENT DOCUMENTS

| | | | |
|---|---|---|---|
| 7,070,300 | B2 | 7/2006 | Harbers et al. |
| 7,091,653 | B2 | 8/2006 | Ouderkirk et al. |
| 7,108,386 | B2 | 9/2006 | Jacobson et al. |
| 7,286,296 | B2 | 10/2007 | Chaves et al. |
| 7,316,497 | B2 | 1/2008 | Rutherford et al. |
| 7,378,686 | B2 * | 5/2008 | Beeson et al. ............... 257/100 |
| 7,497,581 | B2 | 3/2009 | Beeson et al. |
| 7,521,862 | B2 | 4/2009 | Mueller et al. |
| 7,525,127 | B2 | 4/2009 | Hattori et al. |
| 7,573,189 | B2 | 8/2009 | Juestel et al. |
| 7,618,157 | B1 | 11/2009 | Galvez et al. |
| 7,665,865 | B1 | 2/2010 | Hulse et al. |
| 2002/0180351 | A1 * | 12/2002 | McNulty et al. ............. 313/512 |
| 2003/0016539 | A1 * | 1/2003 | Minano et al. ............... 362/347 |
| 2003/0034985 | A1 * | 2/2003 | Needham Riddle et al. . 345/589 |
| 2004/0070855 | A1 * | 4/2004 | Benitez et al. ............... 359/858 |
| 2004/0159900 | A1 * | 8/2004 | Ouderkirk et al. ........... 257/431 |
| 2004/0228131 | A1 | 11/2004 | Minano et al. |
| 2006/0034084 | A1 * | 2/2006 | Matsuura et al. ............ 362/293 |
| 2006/0066192 | A1 | 3/2006 | Beeson et al. |
| 2006/0203468 | A1 | 9/2006 | Beeson et al. |
| 2007/0064407 | A1 | 3/2007 | Huang et al. |
| 2007/0103912 | A1 | 5/2007 | Namii |
| 2007/0278512 | A1 | 12/2007 | Loh et al. |
| 2007/0279907 | A1 * | 12/2007 | Goto et al. ................... 362/277 |
| 2007/0297179 | A1 | 12/2007 | Leung et al. |
| 2008/0030993 | A1 | 2/2008 | Narendran et al. |
| 2008/0094829 | A1 | 4/2008 | Narendran et al. |
| 2008/0117500 | A1 | 5/2008 | Narendran et al. |
| 2008/0218992 | A1 | 9/2008 | Li |
| 2008/0310158 | A1 | 12/2008 | Harbers et al. |
| 2009/0225529 | A1 | 9/2009 | Falicoff et al. |
| 2009/0262516 | A1 | 10/2009 | Li |
| 2009/0278146 | A1 | 11/2009 | Maeda |
| 2010/0109036 | A1 * | 5/2010 | Chen et al. .................. 257/98 |
| 2010/0165599 | A1 * | 7/2010 | Allen .............................. 362/84 |
| 2010/0239207 | A1 * | 9/2010 | Bourget ......................... 385/31 |
| 2010/0290226 | A1 * | 11/2010 | Harbers et al. ............... 362/235 |

OTHER PUBLICATIONS

International Search Report and Written Opinion, International Application No. PCT/US2011/021465, International Filing Date Jan. 17, 2011.

* cited by examiner

CONSTRAINED FOLDED PATH RESONANT WHITE LIGHT SCINTILLATOR

FIELD OF THE INVENTION

This invention relates to light sources and the manufacturing of light sources. In particular, this invention relates to light sources and "light engines" that are used for specific light tasks including, for example, flash lights, automotive lights, streets and public areas as well as industrial area lighting and medical illumination.

BACKGROUND OF THE INVENTION

With the development of the Light Emitting Diode (LED) for use in the lighting industry, the opportunity for energy savings continues to be significant for individuals and society as a whole. A major hurdle impeding the realization of energy savings, however, is the cost of installation or manufacturing. In particular, many of the new technological improvements which greatly improve the luminous efficacy of white LEDs come with disadvantages in the manufacturing process.

In the manufacturing of a common white light LED, a phosphor powder blend is normally mixed with an encapsulant and deposited as a layer onto the surface of an emitter junction. Many emitter junctions are narrow wavelength band blue or near ultraviolet (UV) diodes, with a Full Width at Half Maximum (FWHM) of only 40 nm. The phosphor blend is created to absorb the blue or UV wavelengths and reemit broadband green to red wavelengths. The ratio of blue absorption to secondary green to red emissions determines the color temperature of the emitted white light. This is a straightforward process and as such any improvements to increase the luminosity output add complications to this process which can increase the manufacturing cost.

Failures that plague the above approach include heat degradation of the phosphor due to its proximity to the emitter junctions. The emitter junctions run at relatively high temperatures (>70 deg C.) against an ambient background (25 deg C.). The encapsulant degrades with higher temperatures, often resulting in discoloration and inefficient transmitters in the blue or the visible wavelength region. Additionally, the encapsulant acts as a thermal blanket on top of the emitter junctions causing a further loss of efficiency. Close proximity of the phosphor layer to the emitter junctions also creates an additional loss of white luminosity, as efficient emitters by definition (thermo-dynamic blackbodies) must also be efficient absorbers, thus white light generated near the emitters is lost energy.

There exists another limitation to the above approach: the relatively small area of emission. This creates an increase in luminosity but spreads the light output over a small cone angle, thus creating a very high brightness. Such brightness levels can pose a threat to the human vision system and can contribute to migraines, seizures, and temporary washout of the human eye. Yet another limitation to the above approach is that it is not directly scalable. It is not an easy task to increase luminosity by adding more emitter junctions and thicker layers of phosphor. Such endeavors increase the heat load in a non-linear way while adding more of the "blanket" effect from the phosphor encapsulant.

SUMMARY OF THE INVENTION

The aforementioned problems are overcome by the present invention which includes a volumetric light emitter that can be manufactured independently of an emitter junction. The volumetric light emitter includes a first conic reflector including an aperture for a light source or an emitter junction, a second conic reflector opposite the first conic reflector for collimating light emitted by the light source, and a volumetric light conversion element extending between at least a portion of the first reflector and at least a portion of the second reflector.

In one aspect of the invention, the light conversion element includes phosphor particles dispersed in a resin to convert light emitted by the light source from a first wavelength to a second wavelength, the second wavelength being longer than the first wavelength. As disclosed, the light conversion element is substantially solid, and includes an annular outer surface, wherein light is emitted through the annular outer surface in a generally toroidal pattern. Additionally, the light conversion element preferably includes a cylindrical portion or a frusto-conical portion being coaxial with the first and second conic reflectors.

In another aspect of the invention, the first conic reflector is elliptical and the second conic reflector is parabolic. The volumetric light emitter includes a negative mirror adjacent the vertex of the second conic reflector. Additionally, the volumetric light emitter includes an elliptical element adjacent the first conic reflector, wherein the first conic reflector and the elliptical element define a coextensive aperture for the light source.

The volumetric light emitter can be optically bonded to one or more emitter junctions as a final step, thus creating a simple volumetric light engine wherever a light filament or arc may be used. This invention acts as a bridging technology between LED junction manufacturers and luminaire manufacturers, which delivers the lighting requirements to the end user. This allows for a common design to be implemented with a variety of LED junctions and heat sink arrangements. Another benefit of this invention lies in integrating three specific optical tasks into one simple and manufacturable form. The three optical tasks are: 1) light gathering and placement from emitter junctions, 2) improving utilization and containment of pump light, and 3) down conversion and emission of white light. This integration opens up new designs for luminaires and possesses the benefit of ease of retrofitting older structures with LED sources.

These and other advantages and features of the invention will be more fully understood and appreciated by reference to the drawings and the description of the current embodiments.

DESCRIPTION OF THE CURRENT EMBODIMENT

Figure 1:
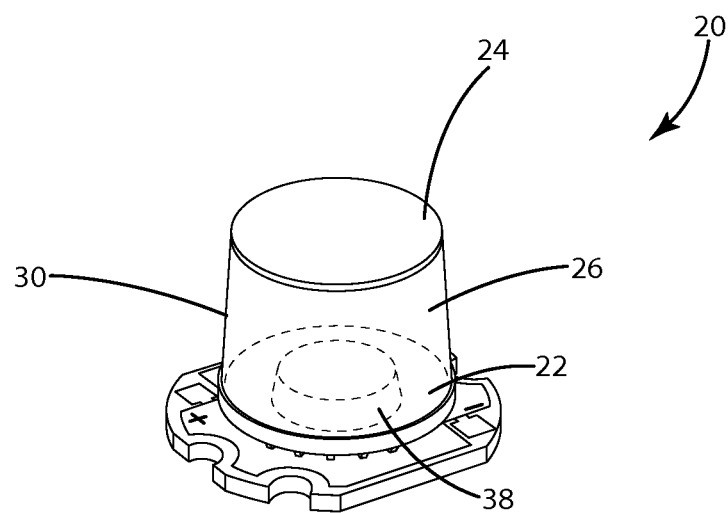
FIG. 1 is a perspective view of a first embodiment of the invention.

A main focus of conventional LED research is to maximize luminosity while reducing the energy consumption, i.e., luminous efficacy. Even though this seems to be the best path to success, it is fraught with gains in luminosity which are not practical for the mass production environment that white LED-based luminaries will need to be at. A wiser approach is to look at the costs of producing white luminosity. These costs break down to operational costs and implementation costs. It is the great savings in operational costs to our society that is driving the development of this technology. However it is the implementation cost that becomes the biggest barrier to moving forward. The present invention addresses this cost barrier—the implementation cost barrier. This is the problem we as a society are trying to solve; the maximization of white luminosity while reducing the number of manufacturing steps involved in reaching the end use luminaire. As explained herein, the present invention can perform three distinct optical functions in a single molded component. The first optical task is to gather the light from the LED junction source and convert it to a more usable format. The second optical task is to create a gain function in the intensity of the Deep Blue Light (DBL) while constraining the DBL losses. The third optical task is to create an optical environment for best down conversion efficiency. As explained below, the three optical functions lead to improvements on seven parameters which cause the luminosity to produce high performance and which offer a simple manufacturable design. Due to its single piece layout, the present invention also lends itself to cost effective manufacturing.

With the above optical tasks in mind, the present invention provides a volumetric light emitter which constrains DBL into a light conversion chamber to thereby control losses and maximize the probability of white light generation via phosphorescence. This is achieved, in part, by making use of a concept from laser physics: the resonant cavity. The purpose of a resonant cavity is to confine the DBL such that the only loss in the DBL is from the excitation of the phosphors within the resonator structure. The Applicant acknowledges that the requirements of an operational laser resonant cavity—High Q status, cavity length=N×Wavelength, Spectral Line width of 1 nm, etc—cannot be achieved from an LED source. The terms 'resonant cavity' and 'resonant structure' are used as a descriptor in creating a visual reference for describing the present invention. This resonant structure, or Constrained Folded Path Cavity (CFPC), possesses reflectors at opposite ends. One purpose of the CFPC is to cause the DBL to repeat its path of propagation a number of times over, while reducing the number of exit paths that allow the DBL to escape. Current repeat propagations vary between 4 and 40, depending on the resonant model chosen, not in the thousands or millions as required for a laser resonant cavity. This will increase the intensity of DBL while keeping it contained within a known volume. One embodiment of the resonant structure is the hemi-confocal cavity structure as shown in FIGS. 1-8, though the invention may utilize other forms of multi-pass folded structures.

In addition to constraining DBL in a resonant cavity, the volumetric light emitter radiates Down-Converted White Light (DCWL) in a toroidal or a spherical pattern. This is accomplished by using a remote phosphor blended into a resin material, which forms a three-dimensional or volumetric light conversion element in the resonant structure of the CFPC, thus creating a volumetric white light radiator In the present embodiment, a phosphor, such as EY4453 by Internatix, is premixed into an acrylic, polycarbonate, Nylon, or polystyrene resin for injection molding, such as Nylon 6/66 by BASF (marketed as ULTRAMID®). The phosphor-doped light conversion element can optionally be molded with the curvatures of the reflectors of the CFPC. Additionally, the density of the phosphor is such that the volumetric light conversion element is translucent to the DBL, not opaque. For example, if the DBL will make 6 reflections within the CFPC, then it is desirable to absorb 16.67% per pass with total absorption at 100% for 6 reflections. It is also possible to utilize this technology with castings, extruding, press forms, or machining to achieve the desired form.

The volumetric white light emitter of the present invention may also be used in conjunction with an optical coupler, such as the optical coupler disclosed in U.S. patent application Ser. No. 12/405,398 to Bourget, filed on Mar. 17, 2009, and titled "High Efficiency Optical Coupler," which is incorporated herein by reference. In particular, a High Efficiency Optical Coupler (HEOC) can convert a Lambertian source into a non-Lambertian radiator to reduce the Numerical Aperture (N.A.) of the source light. This improves the "usability" of the DBL. By choosing the correct radii and conics, a bi-modal intensity pattern output can be created, and the HEOC can to collect up to 98% of all DBL and place it where it is most likely that blue photons will interact with phosphor materials. Accordingly, the present invention combines a HEOC, a constrained folded path cavity, and a toroidal radiator into a single element. Several benefits can accrue from the present invention:

(1) more efficient transfer (up to 98%) of DBL into the phosphorescence region;

(2) "resonant" coupling within the phosphorescence region for multi-pass intensity gain of DBL;

(3) reduced white light loss due to reabsorption at the emission junction(s);

(4) less complex heat sink and heat sink costs due to heat flow improvement attributed to the flexibility of location of the emitter junction(s);

(5) improved temperature stability and less temperature light output degradation due to remote phosphor effect;

(6) fine tuning of chromaticity based on cavity length; and (7) reduced manufacturing loss yields due to fewer mechanical operations at the emitter junction(s).

Accordingly, the embodiments of present invention provide multiple improvements.

I. First Embodiment

Figure 2:
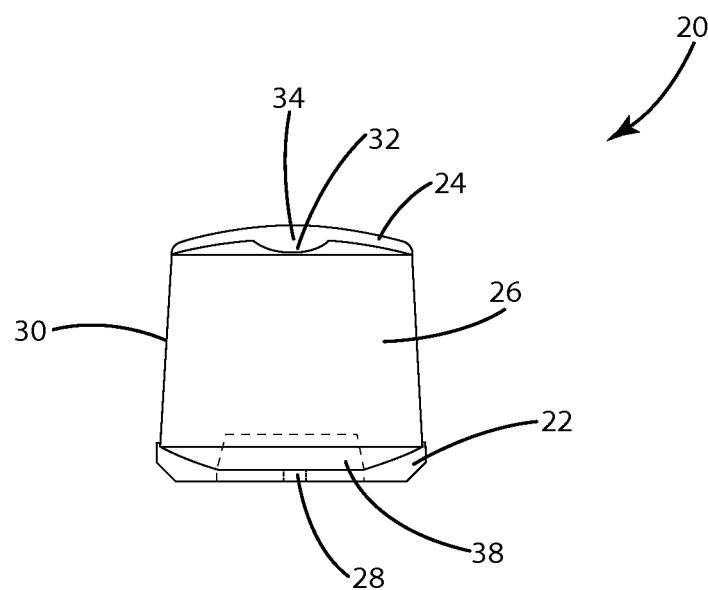
FIG. 2 is a cross-sectional view of the volumetric light emitter in FIG. 1.

A volumetric white light emitter in accordance with an embodiment of the present invention is illustrated in FIGS. 1-8 and generally designated 20. The volumetric white light emitter 20 includes a first conic reflector 22, a second conic reflector 24, and a volumetric light conversion element 26 extending between the first conic reflector 22 and the second conic reflector 24. The first conic reflector 22 defines an aperture 28 for a light source or emitter junction (not shown), and the second conic reflector 24 is orientated opposite the first conic reflector for reflecting light from the light source toward the first reflector 22. A convex mirror 32 is positioned adjacent the vertex 34 of the second conic reflector 24. The second conic reflector 24 is shown as parabolic with a focus at the aperture 28 of the first conic reflector 22. Additionally, an elliptical element 38 is positioned adjacent the first conic reflector 22. The elliptical element 38 defines an aperture 40 coincident with the first reflector aperture 28 to direct light from the light source toward the second conic reflector 24. The volumetric light conversion element 26 includes phosphor particles dispersed in a hardened resin to convert light emitted by the light source from a first wavelength to a second wavelength, the second wavelength being longer than the first wavelength. The volumetric light conversion element 26 also includes an outer annular surface 30 to radiate converted light in a generally toroidal pattern. As also shown in FIGS. 1-2, the volumetric light conversion element 26 is generally frusto-conical or cylindrical, and is coaxial with the first and second conic reflectors 22, 24.

As explained below, the volumetric white light emitter 20 can be adapted to accommodate a specific LED based on its peak emission wavelength. For example, the volumetric white light emitter 20 of the present embodiment is configured to down-convert DBL light from an LED junction having a DBL emission wavelength of 455 nm. The volumetric light conversion element 26 includes a phosphor chosen with a main radiation peak of 570 nm (Yellow) and a FWHM of 90 nm—a typical "off the shelf" phosphor material. The design goal is to convert at least 80% of the emitted blue light into the yellow light output. The blending of the remaining blue light and the phosphorescent yellow light creates to the human eye a lower Color Rendering Index (CRI) of white light (while lower CRI light is not accurate for color measurement, it is adequate for many general illumination applications). For a single junction system with an emission area of 1.3 mm sq. having 1.14 mm on a side, typical operational parameters include an operating current (Iop) of 350 mAmps with a voltage drop of 3.4 Vdc for a power consumption of 1.2 Watts. A typical output conversion efficiency of 25% yields a radiant power of 0.3 Watts. Expressed as luminosity, the value at 455 nm with 36.5 lm/Watt×0.3 Watts equals 11 lumens of blue light.

The second conic reflector 24 is selected to have a diameter about ten times larger than the baseline of the emitter. In the present embodiment, this sets the operational diameter of the second conic reflector 24 at 11. mm. For a surface mount junction, the angle for the FWHM of the Lambertian intensity distribution is typically 60 degrees, corresponding to an N.A. of 0.866. For light propagating through an acrylic resin medium (Index of Refraction=1.497), this same N.A. creates the angle of intensity of 35.4 degrees. This angle is used in combination with the operational diameter to calculate the radius of the second reflector 24 and the cavity length. As noted above, one purpose of the second conic reflector 24 is to collimate the reflected rays and direct them toward the first conic reflector 22. From the Mirror Formula, a mirror's radius being equal to twice the focal length, sets the radius of the second conic reflector 24 equal to the twice the length from the emitter junctions to the second conic reflector 24:

Radius of Second Reflector=2×(11.4 mm/2)/Tan 35.4°=16.0 mm.

This suggests that the cavity volume be roughly 0.82 cm$^3$ from the following formula:

$V = Pi \times R^2 \times L$

While the second conic reflector 24 is parabolic with a numerical conic value of −1.00, it is also possible to make variations in the conic, thus changing the shape from hyperbolic to spherical based on the desired cavity constraints.

Figure 3:
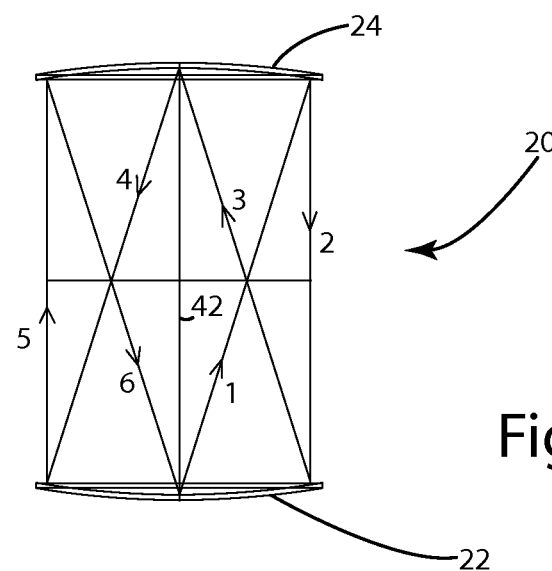
FIG. 3 is an optical ray trace of a cross-sectional view of a variation of the volumetric light emitter in FIG. 1.
Figure 4:
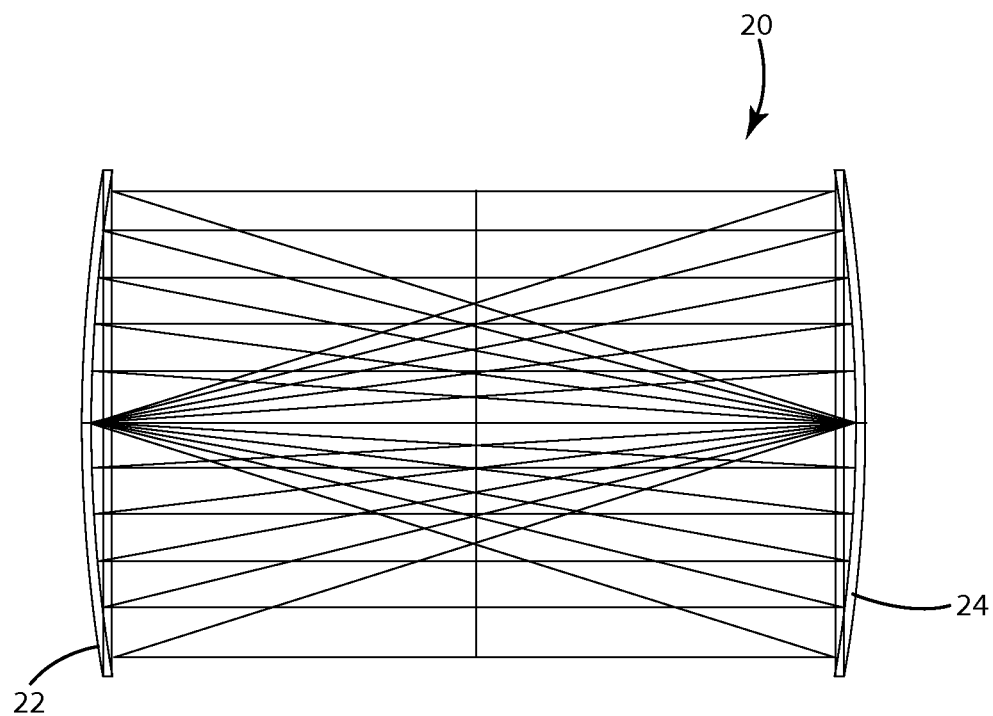
FIG. 4 is an optical ray trace of a cross-sectional view of a variation of the volumetric light emitter in FIG. 1.
Figure 5:
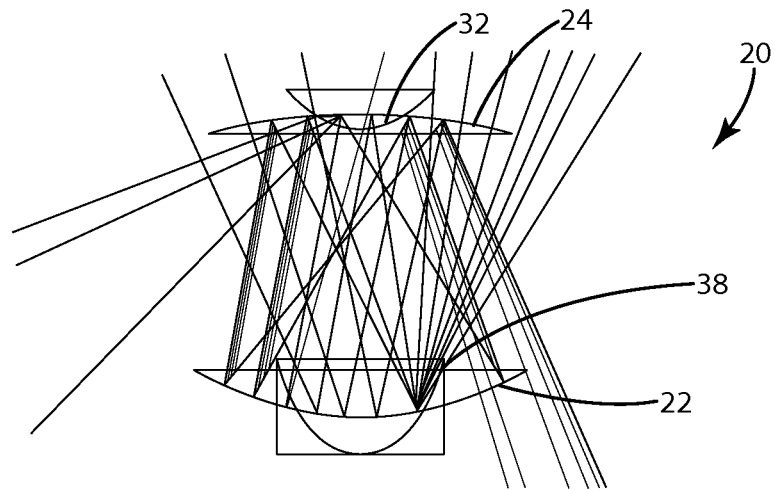
FIG. 5 is an optical ray trace of a cross-sectional view of the volumetric light emitter in FIG. 1.

The purpose of the first conic reflector 22 is to gather the collimated light from the second conic reflector 24 and bring it to a focal plane. It is desirable, however, to set the focal plane to intersect a point on the second conic reflector 24 such that the ray path of the DBL crosses the main Z axis 42 and retraces its path back to the emitter junctions. The choice here is how many reflective paths to have between the first and second conic reflectors 22, 24. In the current embodiment we have 6 reflections as illustrated in FIG. 3, however some models have demonstrated up to 40 reflections as illustrated in FIG. 4. The number of reflective paths is based on the phosphor density appropriate to create the down converted white light. More reflective paths will mean more DBL will be absorbed for a given density of phosphor. This implies a warmer 3000 k type of light will be generated. In the current embodiment, the first conic reflector 22 is an ellipse with a conic value of −0.8., though a range from −0.7 to −0.9 is appropriate depending on the design of resonator. As mentioned above with the second conic reflector 24, the first conic reflector 22 may take any conic form where the refocus conditions allow a retrace over previous paths As shown in FIG. 5, a small positive element, for example an elliptical mirror 38, is placed at the vertex of the first conic reflector 22. The elliptical mirror 38 gathers DBL that is emitted at or near 90° to the surface of the emitter junctions. Another benefit is the reduction of the coupler outside diameter which can be achieved by breaking the first conic reflector 22 into two discontinuous elliptical curves. The conic constant of the first conic reflector 22 is maintained while the radius of curvature and the diameter are significantly reduced. The curves can be produced as separate components or as a single molded or machined element.

Figure 6:
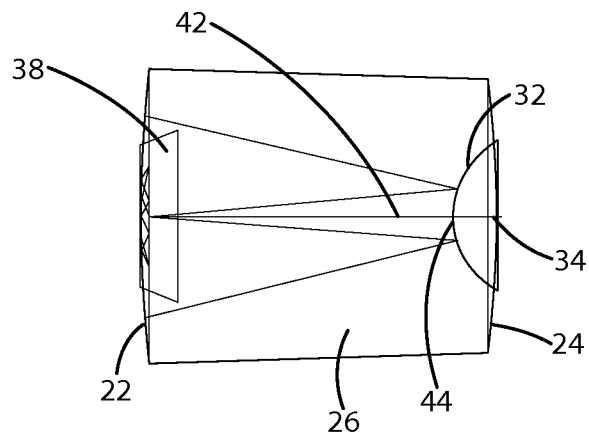
FIG. 6 is an optical ray trace of a cross-sectional view of the volumetric light emitter in FIG. 1 illustrating a ray trace impinging a convex mirror.
Figure 7:
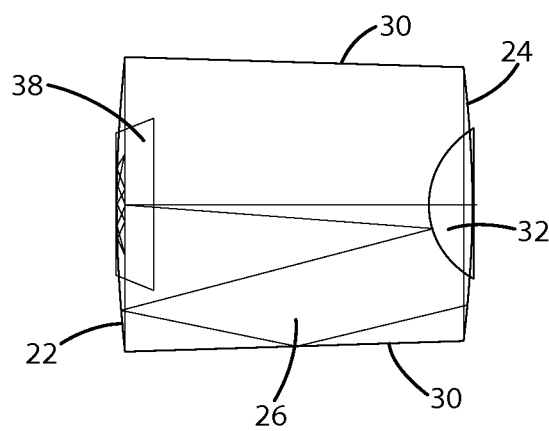
FIG. 7 is an optical ray trace of the volumetric light emitter in FIG. 1 illustrating a ray trace impinging the outer annular surface of the light conversion element.

It is preferable to add a small negative element, for example a convex mirror 32, placed at or adjacent the vertex 34 of the second conic reflector 24 to diverge the near axial propagated light emitted from the emitter junction(s). Without this negative element 32, reflected DBL off of the second conic reflector 24 can retrace its path along the main axis 42 and intersect the junction(s) surface. The diameter of the negative element 32 will normally not be greater than one-third of the diameter of the second conic reflector 24. As shown in FIG. 6, the vertex 44 of the negative element 32 is located before the vertex 34 of the second conic reflector 34 along the main Z axis 42. The radius of the negative element is chosen so as to transfer the reflected rays to the outside of the first conic reflector 22. As shown in FIG. 7, the rays will normally reflect off of the first conic reflector 22 and intersect the outside wall 30 of the resonant cavity 20 with a shallow angle of incidence to have substantial internal reflection, assisting in keeping the DBL confined within the cavity structure. After the placement of the negative surface a refocusing of the first conic reflector 22 may be required. The focal point of the first conic reflector 22 can be on the surface of the negative element 32 to facilitate the retracing of the optical path.

Figure 8:
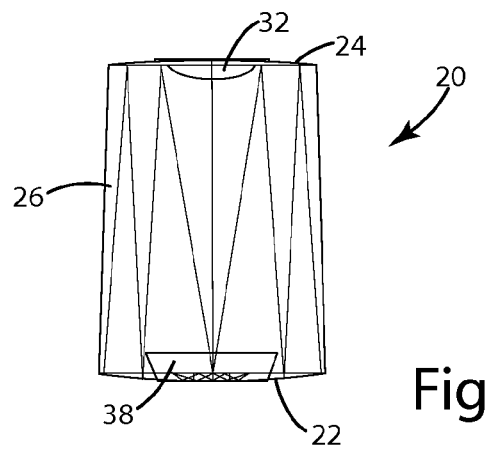
FIG. 8 is an optical ray trace of a cross-sectional view of a variation of the volumetric light emitter in FIG. 1.
Figure 12:
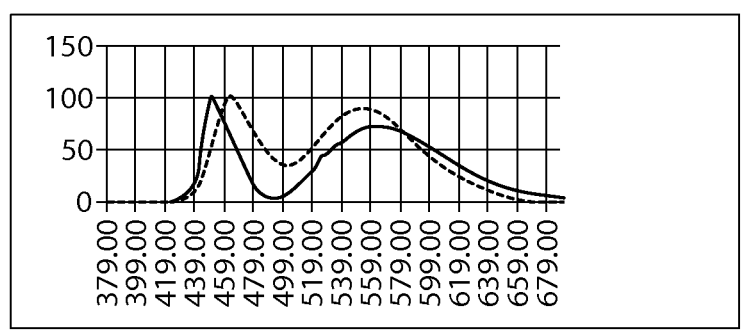
FIG. 12 is a graph illustrating the output spectral distribution of a phosphor light conversion element within a Constrained Folded Path Cavity in accordance with an embodiment of the present invention.

The luminous output spectral distribution of the volumetric white light generator of FIGS. 1-8 is illustrated in FIG. 12. The solid line represents the luminous output from a known phosphor, and the broken line represents the same phosphor operating within a constrained folded path cavity. The difference in the output illustrates increased lumens produced by the cavity structure in accordance with the present embodiment. Though shown above in connection with an LED having a DBL emission wavelength of 455 nm, the volumetric toroidal radiator 20 can also be adapted to accommodate an LED with an emission wavelength of 405 nm, for example. The phosphor blend may have a broadband radiation peak from 480 nm (cyan) to 630 nm (red) and a FWHM 200 nm—a custom blended phosphor material. Again, the goal is to convert up to 100% of the emitted blue light into a broadband white light output by constraining the DBL in the volumetric white light radiator 20 and down-converting DBL light via the phosphorescent element 26. This brings forth a phosphorescent white light which to the human eye has a higher CRI rating. To accommodate the DBL wavelength of 405 nm, the length of the volumetric toroidal radiator 20 is increased to allow more absorption of the DBL on a per reflection basis as shown in FIG. 8. This is in combination with more reflections, for example 8 or 10, within the resonant cavity. This will dictate a longer radius on the first and second reflectors 22, 24 as well as on the negative element 32. The conic constant of the first conic reflector 22 may also increase to drive the ellipse to act more as a parabolic form.

II. Second Embodiment

Figure 9:
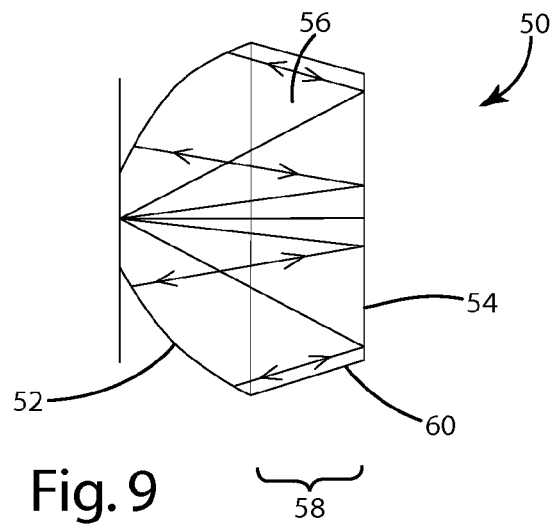
FIG. 9 is an optical ray trace of a cross-sectional view of a second embodiment of the present invention.

A folded spherical cavity 50 in accordance with another embodiment of the present invention is shown in FIG. 9. The folded spherical cavity 50 includes a spherical reflector 52, a planar reflector 54 opposite the spherical reflector 52, and a volumetric light conversion element 56 extending between the spherical reflector 52 and the planar reflector 54. The spherical reflector 52 defines an aperture or seat (not shown) for a light source or emitter junction. Though not shown, a convex mirror can be positioned adjacent the planar reflector 54. Additionally, an elliptical element (not shown) can be positioned adjacent the spherical reflector 52. The elliptical element can also include an aperture coincident with the spherical reflector aperture to direct light from the light source toward the planar reflector 54. The volumetric light conversion element 56 includes phosphor particles dispersed in a resin to convert light emitted by the light source from a first wavelength to a second wavelength, the second wavelength being longer than the first wavelength. The volumetric light conversion element 56 also includes an outer annular surface 60 to radiate converted light in a generally toroidal pattern. As also shown in FIG. 9, the volumetric light conversion element 56 includes a generally frusto-conical portion 58 proximate the planar reflector 54 and coaxial with the spherical reflector 52.

III. Third Embodiment

Figure 10:
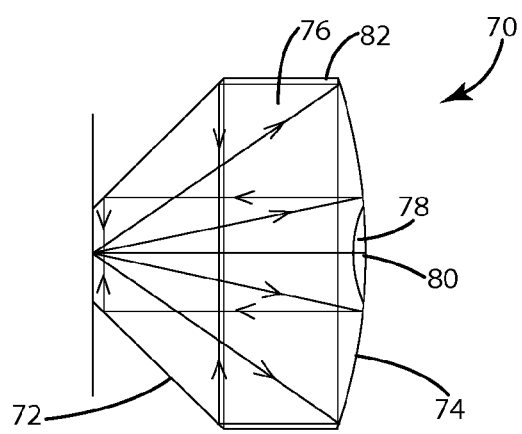
FIG. 10 is an optical ray trace of a cross-sectional view of a third embodiment of the present invention.

A folded transverse cavity 70 in accordance with an embodiment of the present invention is shown in FIG. 10. The folded transverse cavity 70 includes a frusto-conical reflector 72, a conic reflector 74 opposite the frusto-conical reflector 72, and a volumetric light conversion element 76 extending between at least a portion of the frusto-conical reflector 72 and at least a portion of the conic reflector 74. The frusto-conical reflector 72 defines an aperture or seat (not shown) for a light source or emitter junction (not shown). The conic reflector 74 is orientated opposite the frusto-conical reflector 72 for reflecting light from the light source toward the frusto-conical reflector 72. A convex mirror 78 is positioned adjacent the vertex 80 of the conic reflector 74. The conic reflector 74 is shown as parabolic with a focus at the aperture of the frusto-conical reflector 72. Though not shown, an elliptical element can be positioned adjacent the frusto-conical reflector 72, including an aperture coincident with the first reflector aperture to direct light from the light source toward the conic reflector 74. The volumetric light conversion element 76 includes phosphor particles dispersed in a resin to convert light emitted by the light source from a first wavelength to a second wavelength, the second wavelength being longer than the first wavelength. The volumetric light conversion element 76 also includes an outer annular surface 82, radiating converted light through the outer annular surface 82 in a generally toroidal pattern. As also shown in FIG. 10, the volumetric light conversion element 76 is generally cylindrical and coaxial with the conic reflector 74.

IV. Fourth Embodiment

Figure 11:
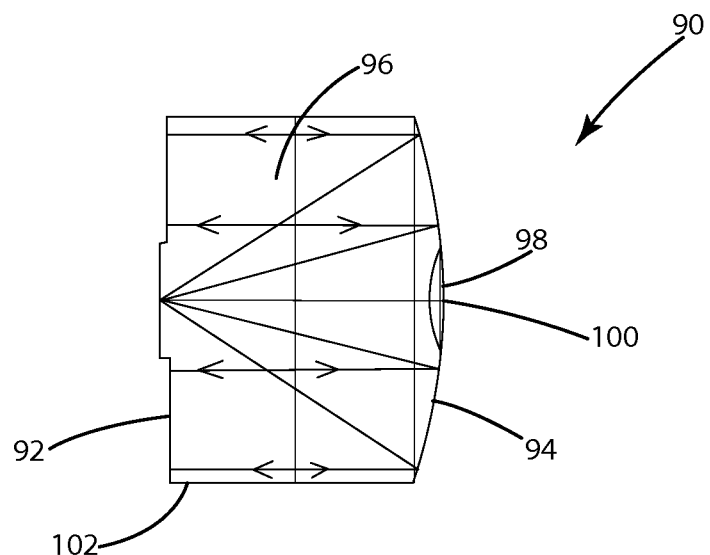
FIG. 11 is an optical ray trace of a cross-sectional view of a fourth embodiment of the present invention.

A folded confocal cavity 90 in accordance with an embodiment of the present invention is shown in FIG. 11. The folded confocal cavity 90 includes a planar reflector 92, a conic reflector 94 opposite the planar reflector 92, and a volumetric light conversion element 96 extending between at least a portion of the planar reflector 92 and a portion of the conic reflector 94. The planar reflector 92 defines an aperture or seat (not shown) for a light source or emitter junction (not shown). The conic reflector 94 is orientated opposite the planar reflector 92 for reflecting light from the light source toward the planar reflector 92. A convex mirror 98 is positioned adjacent the vertex 100 of the conic reflector 94. The conic reflector 94 is shown as parabolic with a focus at the aperture of the planar reflector 92. Though not shown, an elliptical element can be positioned adjacent the planar reflector 92, including an aperture coincident with the planar reflector aperture to direct light from the light source toward the conic reflector 94. The volumetric light conversion element 96 includes phosphor particles dispersed in a hardened resin to convert light emitted by the light source from a first wavelength to a second wavelength, the second wavelength being longer than the first wavelength. The volumetric light conversion element 96 also includes an outer annular surface 102, radiating converted light through the outer annular surface 102 in a generally toroidal pattern. As also shown in FIG. 11, the volumetric light conversion element 96 is generally cylindrical and coaxial with the conic reflector 94.

V. Conclusion

The above embodiments include a volumetric light emitter that can be manufactured independently of the emitter junction or other light source. The volumetric light emitter can be optically bonded to the emitter junctions or other light source as a final step, thus creating a simple volumetric light engine to radiate down-converted white light in a toroidal, spherical, or other pattern.

The above descriptions are those of current embodiments of the invention. Various alterations and changes can be made without departing from the spirit and broader aspects of the invention as set forth in the following claims, which are to be interpreted in accordance with the principles of patent law including the Doctrine of Equivalents.

The embodiments of the invention in which an exclusive property or privilege is claimed are defined as follows:

1. An optical emitter comprising:
    a first conic reflector including a first reflector vertex and adapted to receive a light source proximate the first reflector vertex;
    a second conic reflector coaxial with the first reflector, the first and second conic reflectors facing one another and being substantially reflective to light from the light source to define a folded path cavity therebetween; and a volumetric light conversion element between at least a portion of the first conic reflector and at least a portion of the second conic reflector within the folded path cavity, wherein the volumetric light conversion element is adapted to down-convert light reflected between the first and second conic reflectors and emit the down-converted light generally radially outward from between the first and second conic reflectors and not through the first and second conic reflectors.

2. The optical emitter of claim 1 wherein the first conic reflector defines an aperture at the first reflector vertex.

3. The optical emitter of claim 1 wherein the volumetric light conversion element interconnects the first and second conic reflectors.

4. The optical emitter of claim 1 wherein the light conversion element includes a plurality of wavelength-converting phosphors.

5. The optical emitter of claim 1 wherein the light conversion element includes an annular outer surface to form at least one of a cylindrical exterior and a frusto-conical exterior.

6. The optical emitter of claim 1 wherein the first conic reflector is elliptical.

7. The optical emitter of claim 1 wherein the second conic reflector is parabolic.

8. The optical emitter of claim 1 wherein the first conic reflector vertex is located at the focus of the second conic reflector.

9. The optical emitter of claim 1 further comprising a convex mirror adjacent the second conic reflector and coaxial with the first conic reflector.

10. The optical emitter of claim 1 further comprising an elliptical element coaxial with the first conic reflector, wherein the first reflector vertex is aligned with one of the elliptical element focus and the elliptical element vertex.

11. A light emitter comprising:
a first reflector defining an aperture for a light source;
a second reflector opposite the first reflector, at least one of the first and second reflectors being a conic, the first and second reflectors being substantially reflective to light from the light source to define a folded path cavity therebetween; and
a volumetric light conversion medium within the folded path cavity, the volumetric light conversion medium including phosphor dispersed in a resin to convert light emitted by the light source from a first wavelength to a second wavelength, the second wavelength being longer than the first wavelength, wherein the volumetric light conversion medium radiates light at the second wavelength generally radially outward from between the first and second reflectors and not through the first and second reflectors.

12. The light emitter of claim 11 wherein the light conversion medium is substantially solid.

13. The light emitter of claim 11 wherein:
the light conversion medium includes an annular outer surface; and
the converted light is emitted through the annular outer surface in a generally toroidal pattern.

14. The light emitter of claim 11 wherein the first reflector is a discontinuous conic reflector.

15. The light emitter of claim 11 wherein the light conversion medium is injection molded.

16. An optical emitter comprising:
a first conic reflector;
a second conic reflector opposite the first conic reflector, the second reflector being substantially reflective;
a third conic reflector opposite the second conic reflector and adjacent the first conic reflector;
a negative mirror adjacent the vertex of the second conic reflector; and
a translucent light conversion element between the first and second conic reflectors, wherein the translucent light conversion element emits light generally radially outward from between the first and second reflectors and not through the first and second reflectors.

17. The optical emitter of claim 16 wherein the first and third conic reflectors define a coextensive aperture for a light source.

18. The optical emitter of claim 16 wherein the first, second and third conic reflectors are coaxial.

19. The optical emitter of claim 16 wherein the light conversion element extends between at least a portion of the first conic reflector and at least a portion of the second conic reflector.

20. The optical emitter of claim 16 wherein the light conversion element includes phosphor dispersed in a resin to convert light emitted by the light source from a first wavelength to a second wavelength, the second wavelength being longer than the first wavelength.

21. The optical emitter of claim 1 wherein the optical emitter comprises a light engine that projects light similar to a light filament or arc.

22. The optical emitter of claim 1 wherein the optical emitter creates a gain function in the intensity of light introduced into the optical emitter.

23. The light emitter of claim 1 wherein:
the light conversion element includes an annular outer surface; and
the converted light is emitted through the annular outer surface in a generally toroidal or spherical pattern.

* * * * *